United States Patent [19]
Dufour

[11] Patent Number: 5,465,061
[45] Date of Patent: Nov. 7, 1995

[54] LOW-CONSUMPTION LOW-NOISE CHARGE-PUMP CIRCUIT

[75] Inventor: Yves Dufour, Caen, France

[73] Assignee: U.S. Philips Corporation, New York, N.Y.

[21] Appl. No.: 201,581

[22] Filed: Feb. 25, 1994

[30] Foreign Application Priority Data

Mar. 3, 1993 [FR] France ................... 93 02464

[51] Int. Cl.[6] ............................................. H03K 17/66
[52] U.S. Cl. .......................... 327/112; 327/111; 327/405; 327/403; 327/108
[58] Field of Search ........................ 307/296.6, 296.7, 307/254, 255, 270, 296.2; 327/108, 484, 534, 538, 542, 112, 111, 405, 403

[56] References Cited

U.S. PATENT DOCUMENTS

| | | | |
|---|---|---|---|
| 3,009,070 | 11/1961 | Barnes | 307/254 |
| 4,115,710 | 9/1978 | Lou | 307/296.2 |
| 4,847,519 | 7/1989 | Wahl et al. | |

*Primary Examiner*—Timothy P. Callahan
*Assistant Examiner*—Jung H. Kim
*Attorney, Agent, or Firm*—Bernard Franzblau

[57] ABSTRACT

A low noise charge-pump circuit with low power consumption and operating in a cyclic mode comprises two current sources connected in parallel, and a current mirror for transforming the current supplied by one of the current sources and coupling it to the output of the other current source. Each of the current sources essentially comprises a transistor controlled from the output (VB) of a reference voltage generator via a respective transistor switch. The reference voltage generator essentially comprises a third transistor similar to the two first-mentioned transistors and in series with a further current source supplying a current Io, and means for making the current through the third transistor equal to the current Io.

21 Claims, 2 Drawing Sheets

LOW-CONSUMPTION LOW-NOISE CHARGE-PUMP CIRCUIT

FIELD OF THE INVENTION

This invention relates to a charge-pump circuit which, starting from a first supply terminal, comprises a first current source and a second current source of similar construction, whose current supplied to a second supply terminal is nominally identical, said current sources being activated independently and cyclically by control signals, i.e. a so-called down signal and a so-called up signal, which circuit also comprises a current mirror having an input arranged in the connection between the first current source and the second supply terminal, and having an output connected to the output of the second current source to form an output terminal of the charge-pump circuit.

BACKGROUND OF THE INVENTION

Such a charge-pump circuit is known from the U.S. Pat. No. 4,847,519. The circuit known from this document comprises two current sources formed by two differential stages operating under cyclic control of up and down signals, a charge pulse being supplied at the output during a time interval in which only one of the two current sources is active. During the remainder of a cycle of the cyclic control signal the current sources are either inactive or simultaneously active, as a result of which no charge is supplied to the output of the circuit. The charge pulses at the output of the circuit are stored in a storage capacitance.

Although the known circuit arrangement has the advantage that it uses two current sources which can be very much alike and can therefore be paired in a suitable manner, it has the serious drawback of permanently consuming the total current of the two current sources owing to the use of the differential circuit.

With respect to the noise characteristics at the output of a charge-pump circuit of this type, a detailed analysis of the situation will show that the average noise is substantially proportional to the duty cycle of the control signals, the noise being substantially zero during the part of the cycle in which both current sources are inactive. To reduce the average noise at the output it is therefore advantageous to use control signals whose duty cycle is as small as possible. Moreover, if the current sources supply a large current, for example, several milliamperes or even some tens of milliamperes, this will improve the ability of a charge-pump circuit to rapidly change the value at the output in response to a sudden variation of the phase of an oscillator to be controlled.

Therefore, the prior-art charge-pump circuit is not suitable for uses in which the current consumption should be minimal, as in the case of battery-powered portable apparatuses.

It is an object of the invention to mitigate the above-mentioned problems. The invention features a charge-pump circuit whose power consumption is substantially smaller than that of the known circuit and whose noise at the output is reduced considerably.

SUMMARY OF THE INVENTION

According to the invention a charge-pump circuit of the type defined in the opening paragraph is characterized in that the first and the second current source essentially comprise a first and a second transistor, respectively, the control electrode of each of said transistors being coupled to the output of a reference voltage generator common to the two transistors via a first transistor switch, controlled by the down signal, for the first transistor, and via a second transistor switch, controlled by the up signal, for the second transistor, and the reference voltage generator comprises a third transistor of a construction similar to that of the two first-mentioned transistors, a reference current source in series with the third transistor, and means for making the current through the third transistor equal to the current of said reference current source. The control electrode of the third transistor carries said reference voltage to be applied to the control electrodes of the first and the second transistor.

Thus, in accordance with the invention the first and the second current source only supply current during the time in which they are activated, which time is defined by the duty cycles of the control signals, which can be as small as $1/10^4$, whereas the third transistor alone permanently supplies the reference current produced by the reference current source. In practice, a reference-voltage generator as defined can be used to feed a plurality of first and second current sources in a manner such that the average current consumption remains very moderate.

Since the control electrodes of the first and the second transistors are driven by the same reference voltage generator, the noise which can appear on the output of this generator is substantially eliminated at the output of the circuit in the phase of the cycle in which both current sources are active simultaneously.

In a preferred embodiment the charge-pump circuit in accordance with the invention is characterized in that the reference voltage generator comprises a feedback amplifier having a first input coupled to a node between the reference current source and the output electrode of the third transistor, having a second input coupled to the control electrode of said third transistor, and having an output supplying said reference voltage.

Depending on the field of use the feedback amplifier can be adapted to the number of current sources fed by this generator and the current supplied by these current sources. Since the output electrode of the third transistor is coupled to one of the inputs of the feedback amplifier, the third transistor will operate with a well-defined and constant voltage.

In order for operating conditions of the third transistor to be, as far as possible, similar to those of the first and the second transistor, it is advantageous if a fourth transistor, serving as a permanently closed switch, is arranged between the second input of the feedback amplifier and the control electrode of the third transistor. The fourth transistor is of a construction similar to that of the transistors of the first and the second switch which control the cyclic activation of the first and the second transistor of the charge pump.

In this way the current sources supply a current which is a most accurate replica of the reference current produced in the reference voltage generator. The current supplied by the first and the second current source can thus be predicted very precisely.

In accordance with the invention a charge-pump circuit may also comprise a voltage shifter included at the first input of the feedback amplifier. This arrangement makes it possible to select an operating voltage for the third transistor which is compatible with the supply voltages and which is close to the operating voltages of the first and the second transistor.

The charge-pump circuit in accordance with the invention can be implemented by means of MOS field effect transistors, by means of bipolar transistors, or suitably by means of a combination of transistors of both types.

The invention also relates to a frequency synthesizer including at least one charge-pump circuit as defined above. A frequency synthesizer which could use the defined charge-pump circuit is described in U.S. Pat. No. 4,814,726, hereby incorporated by reference.

BRIEF DESCRIPTION OF THE DRAWINGS

Further characteristic features and advantages of the invention will become apparent upon perusal of the following description with reference to the accompanying drawings given by way of non-limitative examples, in which.

DESCRIPTION OF EMBODIMENTS

Figure 1:
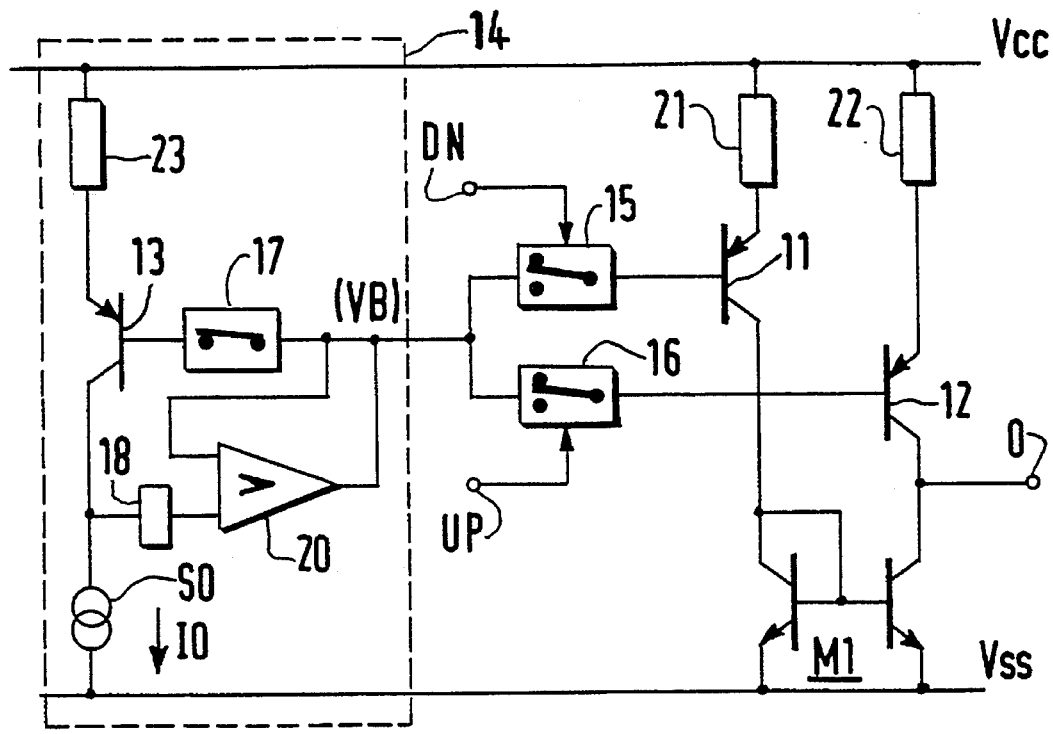
FIG. 1 is a partly block-schematic circuit diagram of a charge-pump circuit in accordance with the invention.

FIG. 1 shows the basic diagram of a charge-pump circuit in accordance with the invention.

Arranged in parallel between the positive supply terminal Vcc and the negative supply terminal Vss are a first bipolar pnp transistor 11, whose emitter is coupled to the terminal Vcc via an emitter resistor 21, and a second pnp transistor 12, whose emitter is coupled to the terminal Vcc via an emitter resistor 22 of the same value as the resistor 21. The collector of the first transistor 11 is connected to the input of a current mirror M1 which comprises bipolar npn transistors and has its output connected to the collector of the second transistor 12 to form a node constituting the output terminal O of the charge-pump circuit. The respective transistor and emitter resistor 11, 21 and 12, 22 form the first current source and the second current source, respectively, of the charge pump. The base of the first transistor 11 is coupled to the output of a reference voltage generator 14, which supplies a reference voltage VB at its output, via a transistor switch 15 which is controlled by a down signal DN. Likewise, the second transistor 12 has its base coupled to the same output of the reference voltage generator 14 via another transistor switch 16 which is controlled by an up signal UP. The down signal DN and the up signal UP are both supplied by a phase comparator associated with the charge-pump circuit in order to form a phase-locked loop, which phase comparator is of a known type and is not shown in the Figure. These signals are pulse-shaped signals with small duty cycles and they are pulse-width modulated.

The reference voltage generator 14 basically comprises a third transistor 13 of a construction similar to that of the first and the second transistors 11, 12. The third transistor has its emitter coupled to the supply terminal Vcc via an emitter resistor 23 of the same resistance value as the emitter resistors 21 and 22 of the first and the second transistors. The third transistor 13 is coupled to the supply terminal Vss via a reference current source So supplying a fixed reference current Io.

In addition, means have been provided for making the current through the third transistor 13 equal to the current Io of said reference current source So. Said means essentially comprise a feedback amplifier 20. A first input of this amplifier 20 is coupled to the node between the collector of the third transistor 13 and the current source So, suitably via a voltage shifter 18. A second input of the amplifier 20 is coupled to the base of the third transistor 13, suitably via a permanently closed transistor switch 17. As will be explained in more detail hereinafter, the switch 17 is formed by a transistor of the same type and of a construction similar to that of the transistors of the switches 15 and 16 effecting the cyclic activation of the first transistor 11 and the second transistor 12. The output of the amplifier 20 is connected to the second input of this amplifier and carries said reference voltage VB, which should be applied cyclically to the first transistor 11 and the second transistor 12 of the charge pump. Thus, such a reference voltage generator 14 comprises means which are entirely similar to the first and the second transistors 11 and 12 of the charge pump, such that when these transistors are activated they exactly reproduce the reference current Io.

Figure 2:
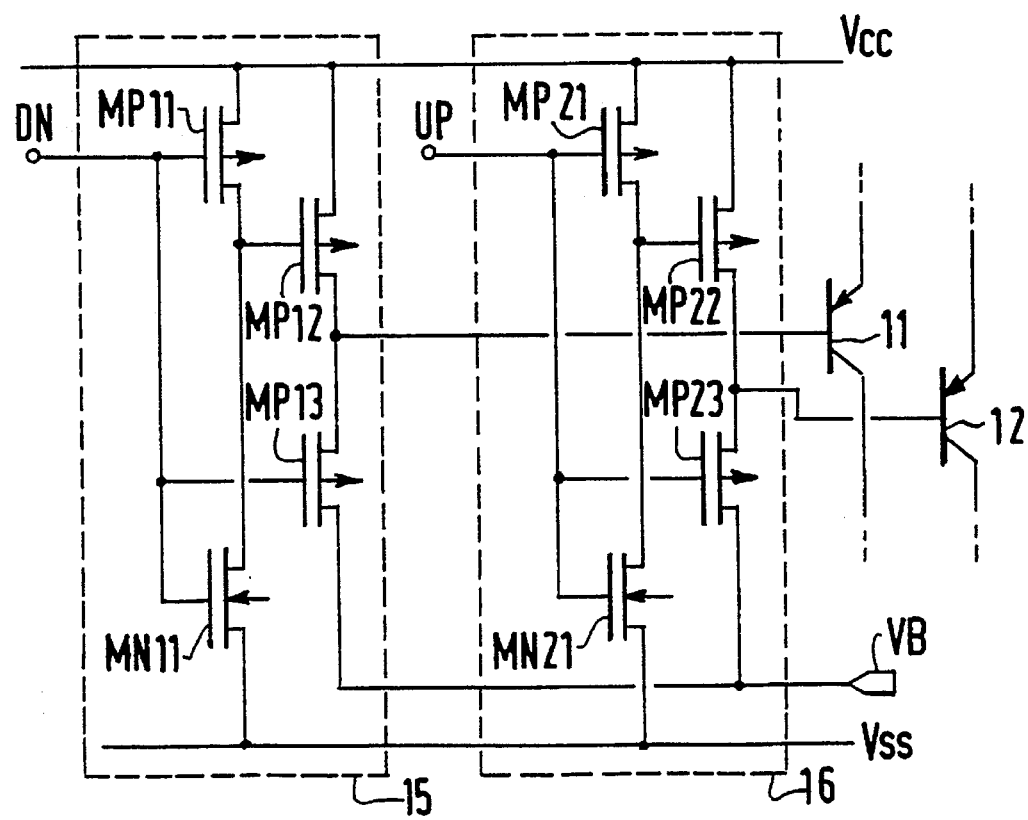
FIG. 2 shows a detailed example of two switches used in the circuit shown in FIG. 1.

Reference is now made to FIG. 2, which shows a preferred example of the switches 15 and 16, shown diagrammatically in FIG. 1. Here, the switches 15 and 16 are implemented by means of MOS field-effect transistors. The switch 15 receives at its input the down command DN, which is applied to the gate of a pair of transistors MP11 and MN11 arranged in series between the supply terminals Vcc and Vss. MP11 is a p-channel transistor and MN11 is an n-channel transistor. This transistor pair supplies a logic output signal which is the inverse of the down command DN. Another pair of p-channel MOS transistors MP12 and MP13 is arranged in series between the supply terminal Vcc and the node carrying the reference voltage VB.

The transistor MP12, which is referred to the supply terminal Vcc, receives at its gate the inverted down signal from the output of the pair of transistors MP11 and MN11. The transistor MP13, which is referred to the reference voltage VB, receives at its gate the down signal DN. Thus, the transistors MP12 and MP13 form a switch, the node common to these two transistors being either at the voltage Vcc or at the voltage VB depending on the down signal DN. The node is connected to the base of the first transistor 11 of the charge pump.

The switch 16 is of a construction entirely similar to that of the switch 15. At its input it receives the up command UP applied to the gate of a pair of MOS transistors MP21 and MN21 forming an inverter for the up signal UP. Likewise, a second pair of transistors MP22 and MP23 are arranged between the terminal Vcc and the line carrying the reference voltage VB and have an output formed by the node between these transistors. This node is coupled directly to the base of the second transistor 12 of the charge pump.

When the first transistor 11 of the charge pump is activated, the transistor MP13 conducts and supplies the reference voltage VB to the base of the transistor 11. Likewise, when the second transistor 12 of the charge-pump is activated the transistor MP23 conducts and transfers the reference voltage VB to the base of this transistor 12. As stated above, the transistor forming the normally closed switch 17 in the reference voltage generator 14 is a p-channel MOS transistor of a construction identical to that of the transistors MP13 and MP23 such that the reference voltage VB allows for the voltage drop across each of these transistors. Thus, the reference current Io is reproduced exactly in the first transistor 11 and the second transistor 12 when they are activated.

When activated simultaneously, the first and the second transistor 11 and 12 of the charge pump are biassed with the same reference voltage VB, as a result of which the noise caused by this voltage at the output O of the charge pump is substantially eliminated.

Figure 3:
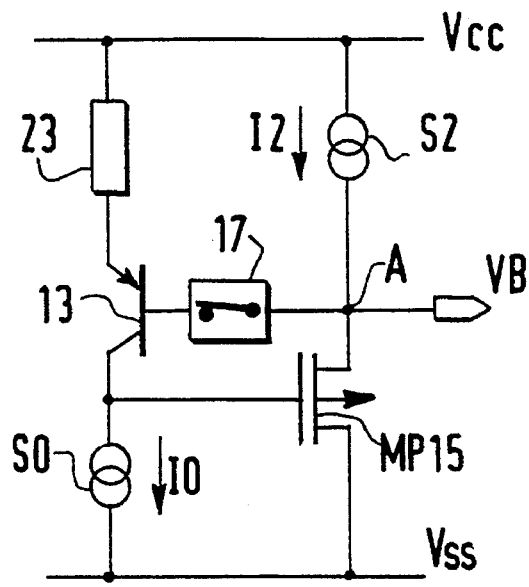
FIG. 3 is a simplified circuit diagram of a feedback amplifier used in the charge-pump circuit in accordance with the invention, and FIG. 4 a shows a preferred version of such a feedback amplifier.

FIG. 3 shows very diagrammatically an example of a feedback amplifier such as the amplifier 20 in FIG. 1. Here, the feedback amplifier is essentially formed by means of a p-channel MOS field-effect transistor MP15 having a gate connected to the node between the collector of the third transistor 13 and the reference current source So. The main current path of the transistor MP15 is disposed between the supply terminal Vss and a node A forming the output carrying the reference voltage VB, which node is also connected to the base of the third transistor 13 via the switch 17 and is coupled to the supply terminal Vcc via a current source S2. The base-collector voltage of the third transistor 13 is therefore determined by the threshold voltage of the transistor MP15 plus the voltage drop across the switch 17. The transistor MP15 absorbs the current from the current source S2 to bring the node A at the voltage VB in a manner such that the third transistor 13 supplies the current Io of the reference current source So. The reference voltage VB appears across an impedance which decreases as the current I2 supplied by the current source S2 increases. It can respond to any demand for base current of the first and the second transistors 11 and 12 of the charge pump.

Figure 4:
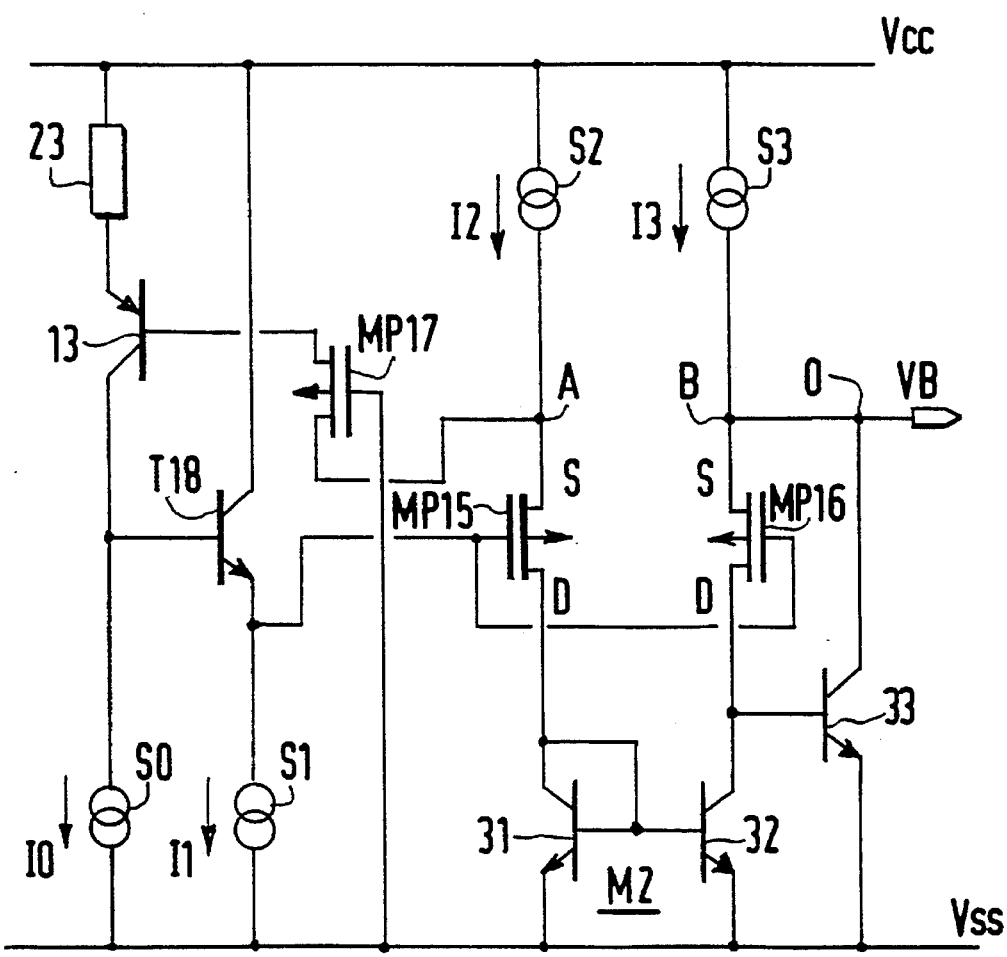

FIG. 4 shows a preferred example of the entire reference voltage generator 14 shown in FIG. 1. The third transistor 13 is again shown with its emitter resistor 23 and with the reference current source So in series with this transistor.

A bipolar npn transistor T18 has its base connected to the collector of the third transistor 13, has its emitter coupled to the supply terminal Vss via another current source S1 supplying a current I1, and has its collector connected directly to the supply terminal Vcc. Here, the transistor T18 forms the voltage shifter 18 shown in FIG. 1. The base of the third transistor 13 is connected to an electrode of the main current path of a p-channel MOS transistor MP17, whose gate is connected to the supply terminal Vss. The transistor MP17 forms a permanently closed switch referenced 17 in FIGS. 1 and 3. The feedback amplifier now comprises a first p-channel MOS input transistor MP15 and a second p-channel MOS input transistor MP16 whose gates are interconnected and connected to the emitter of the transistor T18. The source S of the first input transistor MP15 receives the output voltage of the transistor MP17 forming the permanently closed switch and is also coupled to the supply terminal Vcc via the current source S2, which is as described with reference to FIG. 3 and which supplies a current I2. The source S of the second input transistor MP16 forms the output terminal of the amplifier and is also coupled to the supply terminal Vcc via a current source S3 supplying a current I3. The drain D of the first input transistor MP15 is coupled to the supply terminal Vss via the input of a current mirror comprising bipolar npn transistors 31 and 32. The output of the current mirror M2, which output is formed by the collector of the transistor 32, is coupled to the drain D of the second input transistor MP16 and to the base of a bipolar npn output transistor 33 having its emitter connected to the supply terminal Vss and its collector connected to the output terminal 0 of the amplifier. The node A is as described with reference to FIG. 3. A node similar to the node A is referenced B and couples the current source S3 to the source S of the second input transistor MP16. The feedback amplifier thus formed has a higher power gain than the amplifier shown diagrammatically in FIG. 3. The node A, in contradistinction to that in the arrangement shown in FIG. 3, is now separated from the amplifier output (node B) but the voltage appearing on the node A is exactly reproduced on the node B across an even lower impedance. The current I2 supplied by the current source S2 is selected depending on the requirements and need not have a high accuracy. The current I3 supplied by the current source S3 is selected to be larger than the current I2. The comparator comprising the transistors MP15, MP16, and the current mirror M2 require that identical currents equal to I2 flow in the two input transistors MP15 and MP16. At the node B the output transistor 33 absorbs the difference between the currents I3-I2 (in the absence of current consumption at the output). The voltage obtained on the node B is therefore a precise reproduction of the voltage on the node A so that the reference voltage VB appears across a low impedance.

The principal elements of the feedback amplifier comprising p-channel MOS transistors and bipolar npn transistors respond very rapidly to any demand for current from the reference voltage generator at terminal VB. Such a generator can therefore feed a plurality of first and second current sources which are operated in parallel and may be programmable to suit the needs of the user. It is evident that the current consumed permanently by a reference voltage generator of this type remains comparatively moderate as compared with that of several tens of first and second current sources operated in parallel.

Whereas the examples described above use a combination of bipolar transistors and MOS field-effect transistors, alternative constructions are possible using only bipolar transistors or only field-effect transistors. However, the examples described herein represent a preferred construction.

I claim:

1. A charge-pump circuit comprising: a first supply terminal and a second supply terminal, a first current source and a second current source of similar construction coupled to the first and second supply terminals so that currents supplied to the second supply terminal from the first and second current sources are nominally identical, said current sources being activated independently and with a cyclic activation by down and up control signals, a current mirror having an input branch in a connection between the first current source and the second supply terminal and having an output connected to an output of the second current source to form an output terminal of the charge-pump circuit, wherein the first and the second current source essentially comprise a first and a second transistor, respectively, a control electrode of each of said transistors being coupled to an output of a reference voltage generator common to the two transistors via a first transistor switch, controlled by the down signal, for the first transistor, and via a second transistor switch, controlled by the up signal, for the second transistor, and the reference voltage generator comprises a third transistor of a construction similar to that of the first and second transistors, a reference current source connected in series with the third transistor, and means for making current through the third transistor equal to current of said reference current source, a control electrode of the third transistor carrying a reference voltage to be applied to the control electrodes of the first and the second transistors.

2. A charge-pump circuit as claimed in claim 1, wherein the reference voltage generator comprises a feedback amplifier having a first input coupled to a node between the reference current source and an output electrode of the third transistor, having a second input coupled to the control electrode of said third transistor, and having an output supplying said reference voltage.

3. A charge-pump circuit as claimed in claim 2, further comprising a fourth transistor, serving as a permanently closed switch, coupled between the second input of the feedback amplifier and the control electrode of the third transistor, wherein said fourth transistor is of a construction similar to that of the transistors of the first and the second transistor switches and which control the cyclic activation of the first and the second transistors of the charge pump.

4. A charge-pump circuit as claimed in claim 2, wherein a voltage shifter is coupled to the first input of the feedback amplifier.

5. A charge-pump circuit as claimed in claim 3, wherein the first, the second and the third transistors are of the bipolar pnp type, and the current mirror comprises bipolar npn transistors.

6. A charge-pump circuit as claimed in claim 5, wherein the first and the second switch each comprise complementary MOS field-effect transistors.

7. A charge-pump circuit as claimed in claim 6, wherein the feedback amplifier comprises a first and a second input transistor of the p-channel MOS type, having interconnected gates, a source of the first input transistor receiving an output voltage of the fourth transistor and being coupled to a first associated current source fed by the first supply terminal, a source of the second input transistor forming the output of the amplifier and being coupled to a second associated current source which is also fed by the first supply terminal, a drain of the first input transistor being coupled to an input of a further current mirror comprising bipolar npn transistors, said further current mirror having an output connected to a drain of the second input transistor and to an input of a bipolar npn output transistor having its emitter connected to the second supply terminal and having its collector connected to the output of the amplifier.

8. A charge-pump circuit as claimed in claim 3, wherein a voltage shifter is coupled to the first input of the feedback amplifier.

9. A charge-pump circuit as claimed in claim 1, wherein the first, second and third transistors are of a bipolar pnp type, and the current mirror comprises bipolar npn transistors.

10. A charge-pump circuit as claimed in claim 3, wherein the feedback amplifier comprises a first and a second input transistor of the p-channel MOS type, having interconnected gates, a source of the first input transistor receiving an output voltage of the fourth transistor and being coupled to a first associated current source fed by the first supply terminal, a source of the second input transistor forming the output of the amplifier and being coupled to a second associated current source which is also fed by the first supply terminal, a drain of the first input transistor being coupled to an input of a further current mirror comprising bipolar npn transistors, said further current mirror having an output connected to a drain of the second input transistor and to an input of a bipolar npn output transistor having its emitter connected to the second supply terminal and having its collector connected to the output of the amplifier.

11. The charge-pump circuit as claimed in claim 1 wherein the first transistor switch comprises first and second complementary MOS transistors serially coupled between said first and second supply terminals and with a common node therebetween coupled to the control electrode of the first transistor, and the second transistor switch comprises third and fourth complementary MOS transistors serially coupled between said first and second supply terminals and with a common node therebetween coupled to the control electrode of the second transistor.

12. A charge-pump circuit comprising:

first and second supply terminals, a current mirror having an input terminal, an output terminal, and a common terminal connected to said second supply terminal, a first current source including a first transistor coupled to said first supply terminal and to said input terminal of the current mirror, a second current source including a second transistor coupled to said first supply terminal and to said output terminal of the current mirror, an output terminal coupled to a node between the second transistor and the output terminal of the current mirror, a reference voltage generator having an output coupled to respective control electrodes of the first and second transistors via first and second controlled switches, respectively, means for supplying first and second control signals to respective control terminals of the first and second controlled switches so as to actuate the first and second transistors cyclically by means of a reference voltage produced at the output of the reference voltage generator, and wherein the reference voltage generator comprises;

a third transistor of a type similar to that of the first and second transistors, a source of reference current connected in series with the third transistor to said first and second supply terminals, and a feedback circuit coupled to the third transistor so as to make a current flowing through the third transistor equal to the current of said reference current source.

13. The charge-pump circuit as claimed in claim 12 wherein the feedback circuit of the reference voltage generator comprises a feedback amplifier having a first input coupled to a node between the reference current source and an output electrode of the third transistor, having a second input coupled to a control electrode of said third transistor, and having an output coupled to said output of the reference voltage generator so as to supply said reference voltage to said reference voltage generator output.

14. The charge-pump circuit as claimed in claim 13 wherein said first and second controlled switches comprise transistor switches and said reference voltage generator further comprises a fourth transistor coupled between the second input of the feedback amplifier and the control electrode of the third transistor, said fourth transistor being of the same type as the transistor switches.

15. The charge-pump circuit as claimed in claim 12 wherein said control signals supplying means supplies pulse-shaped signals with a short duty cycle and said first and second current sources supply respective currents that are determined by the source of reference current of said reference voltage generator.

16. The charge-pump circuit as claimed in claim 12 wherein the third transistor comprises a bipolar transistor and the feedback circuit comprises;

a MOS transistor having its gate coupled to a node between the third transistor and the reference current source and a first main electrode coupled to a base of the third transistor and to the first supply terminal via a second source of reference current.

17. The charge-pump circuit as claimed in claim 16 wherein a second main electrode of said MOS transistor is coupled to the output of the reference voltage generator via a further current mirror comprising bipolar transistors.

18. The charge-pump circuit as claimed in claim 17 wherein an output of the further current mirror is coupled to a further MOS transistor and a further bipolar transistor each of which is coupled to said output of the reference voltage generator, and all in a manner whereby the reference voltage at said output of the reference voltage generator reproduces a voltage at the first main electrode of said MOS transistor, said first main electrode of said MOS transistor being separated from said reference voltage generator output at least by said further current mirror.

19. The charge-pump circuit as claimed in claim 12 wherein said reference voltage controls said first and second transistors and said third transistor so that the first and second current sources supply respective currents that are determined by the source of reference current of said reference voltage generator.

20. The charge-pump circuit as claimed in claim 19 wherein said first and second controlled switches comprise transistor switches and said output of the reference voltage generator is coupled to a control electrode of the third transistor via a conductive fourth transistor of the same type as said transistor switches.

21. The charge-pump circuit as claimed in claim 1 wherein said first and second supply terminals are energized by a DC battery and said first and second current sources are coupled in parallel to the first supply terminal.

* * * * *